(12) United States Patent
Mao et al.

(10) Patent No.: US 12,288,770 B2
(45) Date of Patent: Apr. 29, 2025

(54) SEMICONDUCTOR PACKAGES WITH EMBEDDED WIRING ON RE-DISTRIBUTED BUMPS

(71) Applicant: NXP B.V., Eindhoven (NL)

(72) Inventors: Kuan-Hsiang Mao, San Jose, CA (US); Norazham Mohd Sukemi, San Jose, CA (US); Chin Teck Siong, San Jose, CA (US); Tsung Nan Lo, San Jose, CA (US); Wen Hung Huang, San Jose, CA (US)

(73) Assignee: NXP B.V., Eindhoven (NL)

( * ) Notice: Subject to any disclaimer, the term of this patent is extended or adjusted under 35 U.S.C. 154(b) by 414 days.

(21) Appl. No.: 17/660,441

(22) Filed: Apr. 25, 2022

(65) Prior Publication Data

US 2023/0343749 A1    Oct. 26, 2023

(51) Int. Cl.
*H01L 23/495* (2006.01)
*H01L 21/56* (2006.01)
*H01L 23/00* (2006.01)
*H01L 23/498* (2006.01)
*H01L 25/00* (2006.01)
*H01L 25/065* (2023.01)

(52) U.S. Cl.
CPC ........ *H01L 25/0657* (2013.01); *H01L 21/568* (2013.01); *H01L 23/49816* (2013.01); *H01L 24/48* (2013.01); *H01L 24/92* (2013.01); *H01L 25/50* (2013.01); *H01L 2224/48227* (2013.01); *H01L 2224/92247* (2013.01)

(58) Field of Classification Search
CPC .......................... H01L 21/568; H01L 25/0657
USPC .................................................... 257/686, 723
See application file for complete search history.

(56) References Cited

U.S. PATENT DOCUMENTS

| | | | | |
|---|---|---|---|---|
| 5,900,676 A | * | 5/1999 | Kweon | H01L 23/3121 257/E23.125 |
| 5,976,912 A | * | 11/1999 | Fukutomi | H01L 23/3121 257/E23.125 |
| 6,100,594 A | * | 8/2000 | Fukui | H01L 23/3121 257/E21.705 |
| 6,215,182 B1 | * | 4/2001 | Ozawa | H01L 23/3128 174/541 |
| 6,287,893 B1 | | 9/2001 | Elenius et al. | |
| 6,538,336 B1 | | 3/2003 | Secker et al. | |
| 6,921,968 B2 | | 7/2005 | Chung | |
| 7,015,585 B2 | | 3/2006 | Downey et al. | |
| 7,109,059 B2 | | 9/2006 | Wark | |

(Continued)

OTHER PUBLICATIONS

Ivy Qin, et al., "Advances in Wire Bonding Technology for 3D Die Stacking and Fan Out Wafer Level Package," 2017, pp. 1309-1315, 2017 IEEE 67th Electronic Components and Technology Conference, DOI: 10.1109/ECTC.2017.134, publisher IEEE.

(Continued)

*Primary Examiner* — Nitin Parekh (57) ABSTRACT

Semiconductor packages with embedded wiring on re-distributed bumps are described. In an illustrative, non-limiting embodiment, a semiconductor package may include an integrated circuit (IC) having a plurality of pads and a re-distribution layer (RDL) coupled to the IC without any substrate or lead frame therebetween, where the RDL comprises a plurality of terminals, and where one or more of the plurality of pads are wire bonded to a corresponding one or more of the plurality of terminals.

10 Claims, 12 Drawing Sheets

(56) References Cited

U.S. PATENT DOCUMENTS

| | | | |
|---|---|---|---|
| 7,190,068 B2* | 3/2007 | Hackitt | H01L 23/4334 |
| | | | 257/713 |
| 7,745,260 B2 | 6/2010 | Lo | |
| 7,955,953 B2 | 6/2011 | Lo et al. | |
| 8,592,241 B2 | 11/2013 | Hayes et al. | |
| 2002/0005576 A1* | 1/2002 | Sakamoto | H01L 23/49548 |
| | | | 438/125 |
| 2006/0001180 A1 | 1/2006 | Taggart et al. | |
| 2006/0049523 A1 | 3/2006 | Lin | |
| 2009/0152717 A1 | 6/2009 | Lo et al. | |
| 2012/0133053 A1 | 5/2012 | Lo et al. | |
| 2013/0026658 A1 | 1/2013 | Chen | |
| 2016/0056113 A1* | 2/2016 | Ko | H01L 25/0657 |
| | | | 257/797 |
| 2016/0254230 A1* | 9/2016 | Lee | H01L 24/97 |
| | | | 257/659 |
| 2016/0293575 A1 | 10/2016 | Liu et al. | |
| 2019/0006339 A1 | 1/2019 | Lau et al. | |
| 2020/0118993 A1 | 4/2020 | Kang et al. | |

OTHER PUBLICATIONS ip.com; "Redistributed Array Package with Insulated Wires"; retrieved from the Internet https://ip.com/IPCOM/000233362; 5 pages (Dec. 10, 2013).

* cited by examiner

SEMICONDUCTOR PACKAGES WITH EMBEDDED WIRING ON RE-DISTRIBUTED BUMPS

FIELD

This disclosure relates generally to semiconductors, and more specifically, to semiconductor packages with embedded wiring on re-distributed bumps.

BACKGROUND

Semiconductor packages are metal, plastic, glass, or ceramic casings containing semiconductor devices or integrated circuits (ICs). Typically, semiconductor devices or ICs are fabricated on a semiconductor wafer before being diced into individual die, tested, and packaged. A semiconductor package provides a mechanism for its internal devices or ICs to access their external environment, such as a Printed Circuit Board (PCB), via leads (e.g., solder bumps).

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

The following sets forth a detailed description of a mode for carrying out the invention. The description is intended to be illustrative of the invention and should not be taken to be limiting. In this description, the use of relational terms, such as "first" and "second," "front" and "back," "top" and "bottom," "over" and "under," etc. are used to distinguish one entity or action from another entity or action without necessarily requiring or implying a permanent relative position between such entities or actions. Also, some of the figures may be illustrated using various shading and/or hatching to distinguish the different elements produced within the various structural layers. These different elements within the structural layers may be produced utilizing current and upcoming fabrication techniques of depositing, patterning, etching, and so forth. Accordingly, although different shading and/or hatching is utilized in the illustrations, the different elements within the structural layers may be formed out of the same or different materials.

Figure 1:
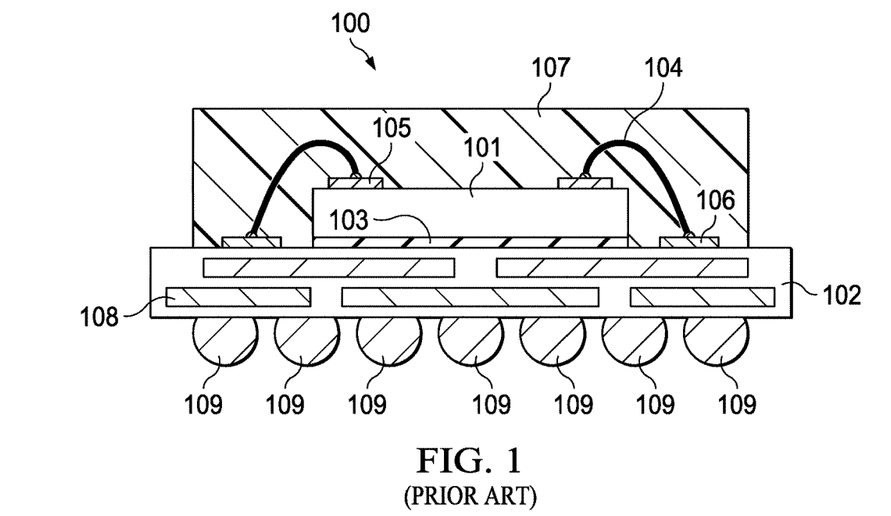
FIG. 1 is a cross-sectional view of a conventional semiconductor package.

FIG. 1 depicts conventional semiconductor package 100 ("Prior Art"). Package 100 includes substrate 102 upon which semiconductor die 101 is mounted via interposer 103. Die 101 includes bond pads 105 that provide access to electrical circuits therewithin. Substrate 102 has several patterned conductive features, including re-distribution (RDL) layer 108 and bond sites 106. Wire bonds 104 extend between bond pads 105 and bond sites 106 to allow semiconductor die 101 to receive power from, and communicate signals to and from, its external environment. After redistribution by RDL layer 108, bond pads 105 of semiconductor die 101 are electrically accessible via corresponding solder bumps 109. Die 101 and wire bonds 104 are encapsulated by mold compound 107.

Generally, the manufacturing of conventional semiconductor package 100 takes place by attaching die 101 to the top surface of substrate 102, fabricating wire bonds 104 between die 101 and substrate 102, encapsulating the assembly with mold compound 107, and fabricating solder bumps 109 on the bottom surface of substrate 102. As the inventors hereof have determined, this approach produces thick semiconductor packages in part due to the presence of substrate 102. Moreover, limitations in photoresist (PR) patterning thickness on substrate 102 restrict the amount of electrical current that can reach die 101, thus reducing the usability of conventional semiconductor package 100 in high-power applications.

To address these, and other concerns, the inventors hereof have developed systems and methods for fabricating semiconductor packages with embedded wiring on re-distributed bumps. A semiconductor package as described herein may use a temporary carrier instead of a substrate carrier (or lead frame) to enable multiple RDL stacking with different signal output and/or bump structures. As a result, these systems and methods may provide thinner semiconductor packages (e.g., total thickness smaller than 300 μm) and/or thicker and wider wire bonds that meet the larger electrical current inputs requirements of high-power applications.

In some embodiments, systems and methods described herein may provide homogeneous or heterogeneous integration using copper (Cu) or gold (Au) wiring to link one or more embedded components and to re-distribute electrical contacts to different bump structures where the signal layout allows fan-in and fan-out designs to multiple layers. With even multiple RDL patterning and stacking, the semiconductor package remains thin because no substrate is used. These systems and methods may provide, for example, pure Cu or Au interconnection (wiring and RDL trace) links between embedded chips and signal output pads or bumps. Moreover, these systems and methods are particularly applicable to large panel development.

FIGS. 2A-L are diagrams illustrating an example of a process for fabricating a semiconductor package with multiple stacked dies and embedded wiring on re-distributed bumps. In this embodiment, the process may begin in FIG. 2A with preparation of temporary carrier 201 (e.g., 3M OneFilm, etc.) with thermal release tape 202 and seed layer 203 sputtered (e.g., 1 k Ti, 2 k Cu), evaporated, or deposited thereon, thus producing prepared temporary carrier 200.

Figure 2A:
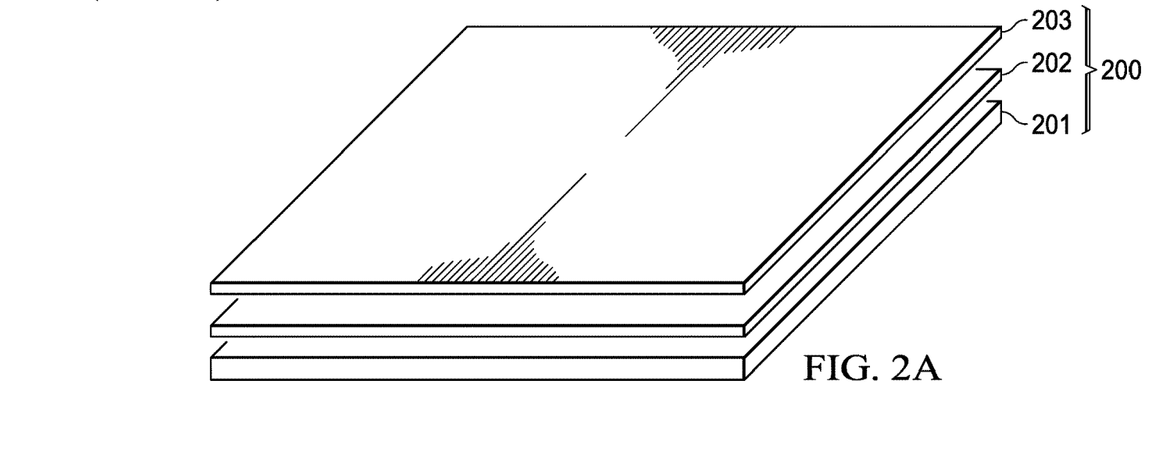
FIGS. 2A-L are diagrams illustrating an example of a process for fabricating a semiconductor package with multiple stacked dies and embedded wiring on re-distributed bumps, according to some embodiments.
Figure 2B:
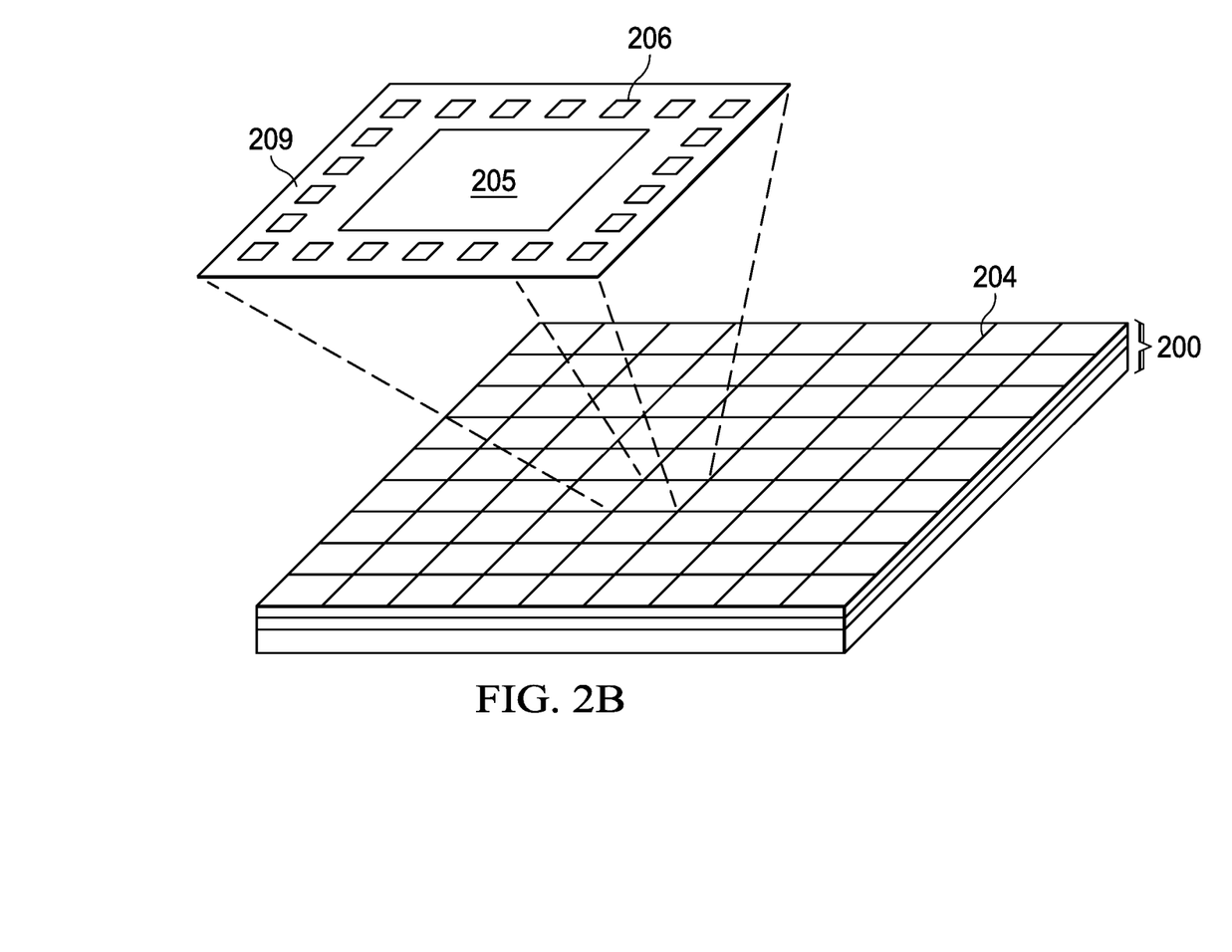

In FIG. 2B, prepared temporary carrier 200 is laser marked with die attach location 205 and wire bond locations 206 in area 209 of grid 204. Conductive structures (e.g., traces, pads, interconnects, vias, pads, etc.) may be formed from an electrically conductive material, examples of which include, but are not limited to: nickel, gold, copper, aluminum, tin, silver, titanium, or other suitable conductive metal or alloy composed of one or more suitable conductive metals.

Figure 2C:
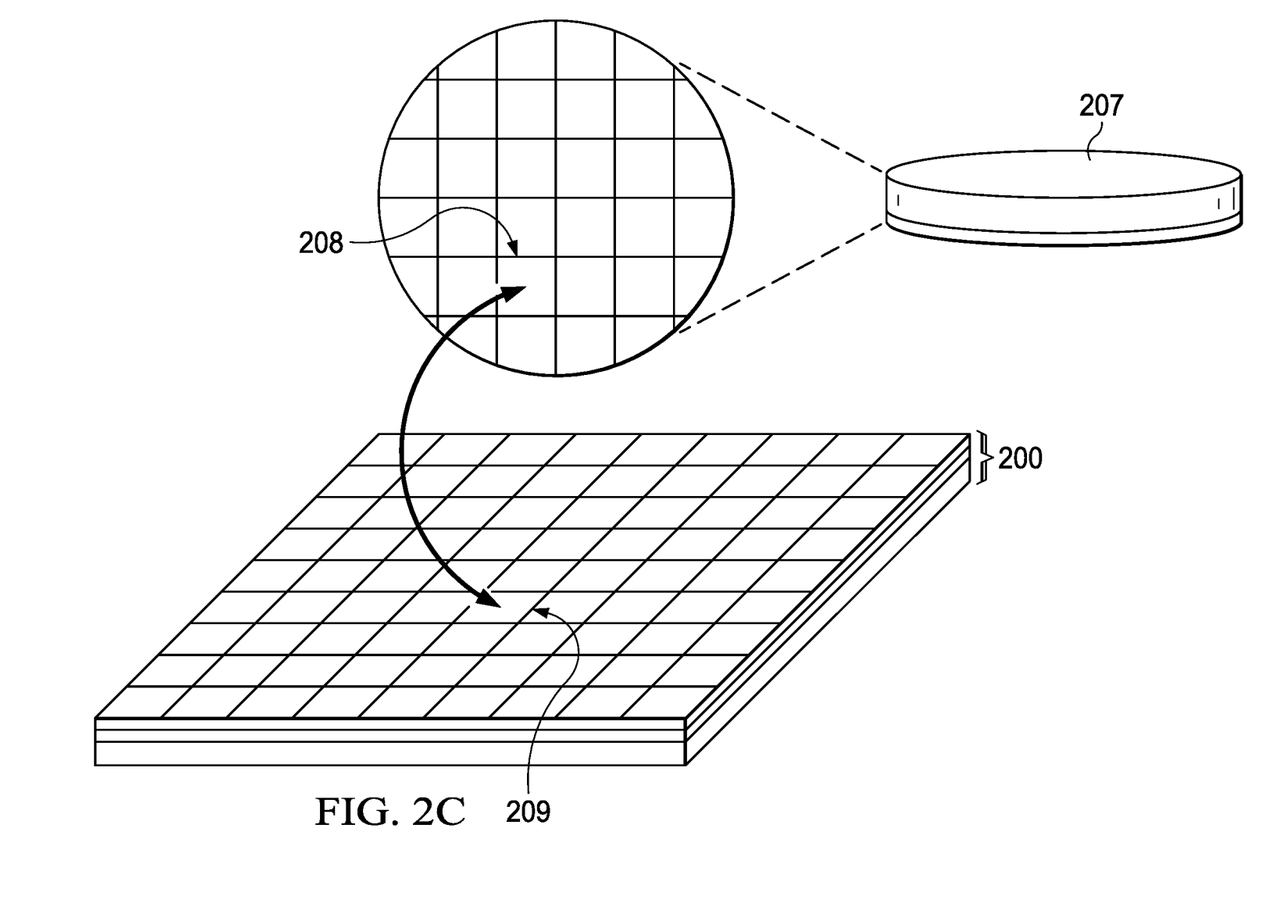
Figure 2D:
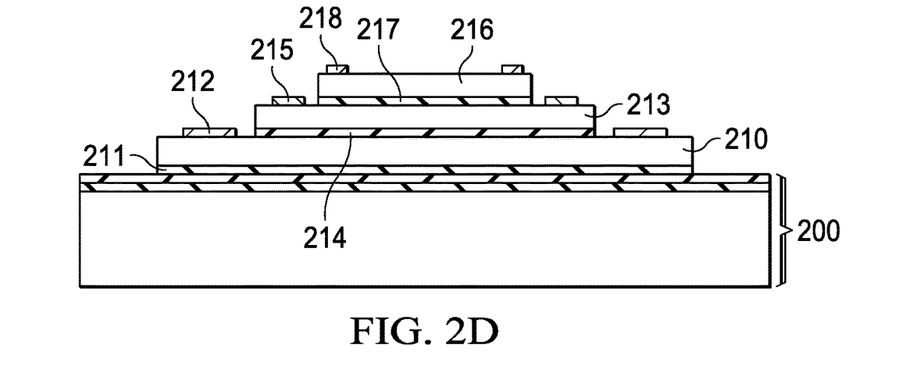

FIGS. 2C and 2D show wafer 207 with area 208 containing die 210 that, after being singulated, is attached to die attach location 205 of area 209 of prepared temporary carrier 200 with die attach film (DAF) 211. Dies 213 and 216 may be stacked on top of die 210 with DAFs 214 and 217, as shown. Each of dies 210, 213, and 216 may include a plurality of pads 212, 215, and 218, respectively.

Each of dies 210, 213, and 216 may be singulated from semiconductor wafer 207, which can be any semiconductor material or combinations of materials, such as gallium arsenide, silicon germanium, silicon-on-insulator (SOI), silicon, monocrystalline silicon, the like, and combinations of the above. Such a semiconductor die includes active circuitry, which may include integrated circuit (IC) components that are active when the die is powered.

Active circuitry is formed on semiconductor wafer 207 using a sequence of numerous operations applied including, but not limited to: depositing semiconductor materials including dielectric materials and metals, such as growing, oxidizing, sputtering, and conformal depositing, etching semiconductor materials, such as using a wet etchant or a dry etchant, planarizing semiconductor materials, such as performing chemical mechanical polishing or planarization, performing photolithography for patterning, including depositing and removing photolithography masks or other photoresist materials, ion implantation, annealing, and the like.

In some embodiments, the active circuitry of a die may be a combination of IC components or may be another type of microelectronic device. Examples of IC components include but are not limited to a processor, memory, logic, oscillator, analog circuitry, sensor, microelectromechanical systems (MEMS) device, a standalone discrete device such as a resistor, inductor, capacitor, diode, power transistor, and the like.

Figure 2E:
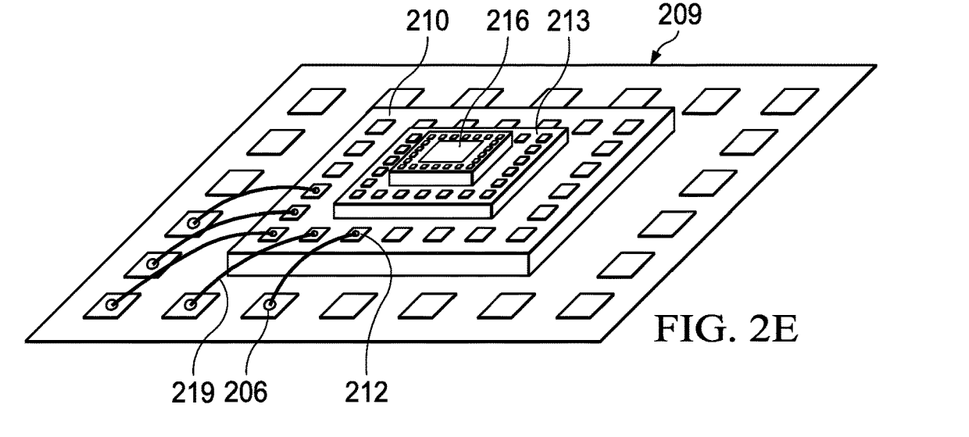
Figure 2F:
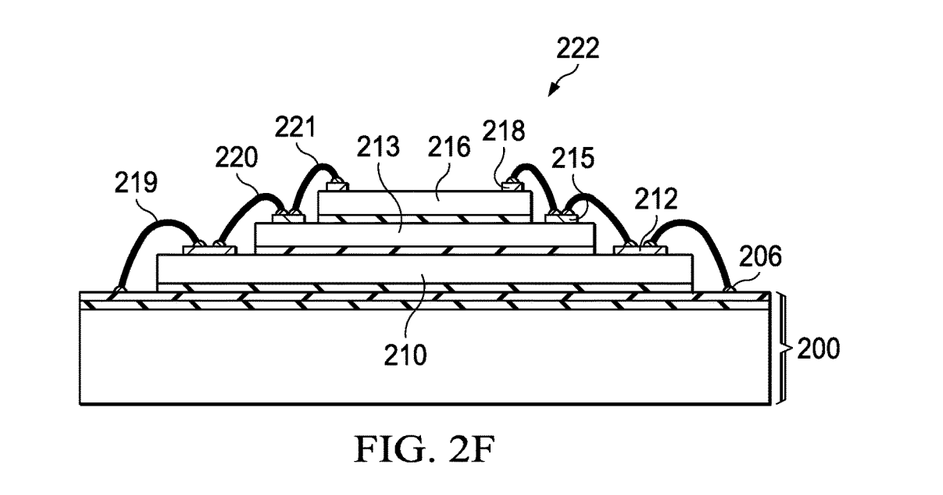
Figure 2G:
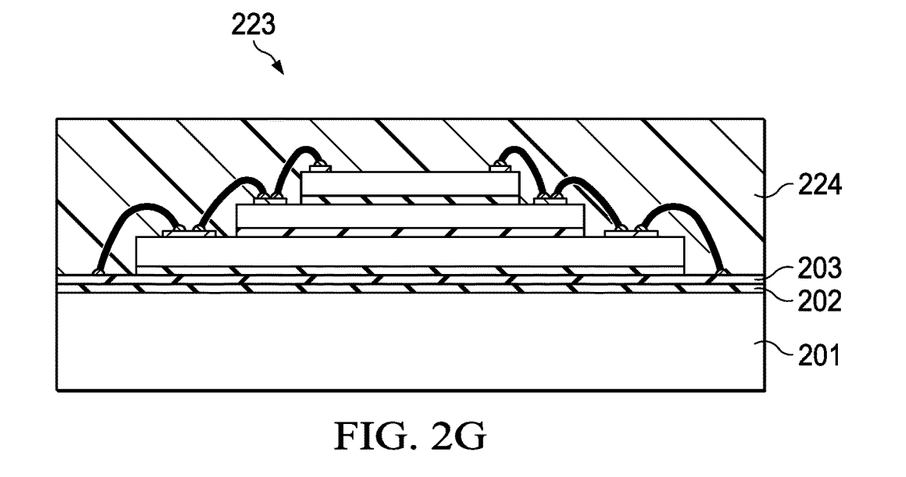

FIGS. 2E and 2F show wire bond 219 formed between pad 212 of die 210 and wire bond location 206, wire bond 220 formed between pad 215 of die 213 and pad 212 of die 210, and wire bond 221 formed between pad 218 of die 216 and pad 215 of die 213, thus producing wire bonded assembly 222. In FIG. 2G, wire bonded assembly 222 is encapsulated by mold compound 224 (e.g., a plastic, resin, polymer, etc.), thus producing encapsulated assembly 223.

Figure 2H:
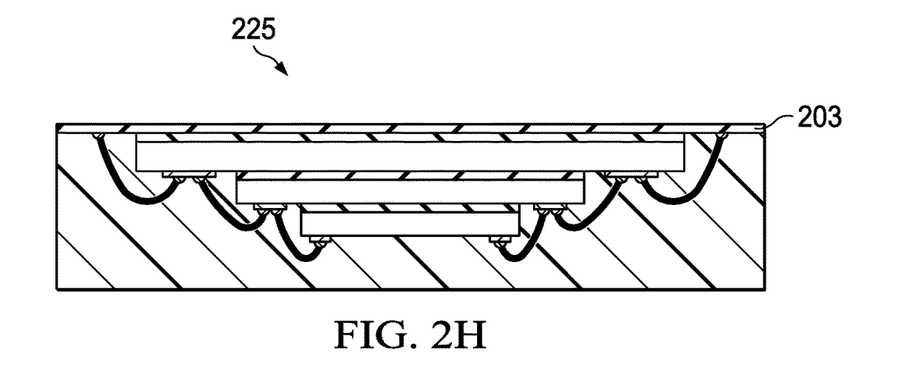
Figure 2I:
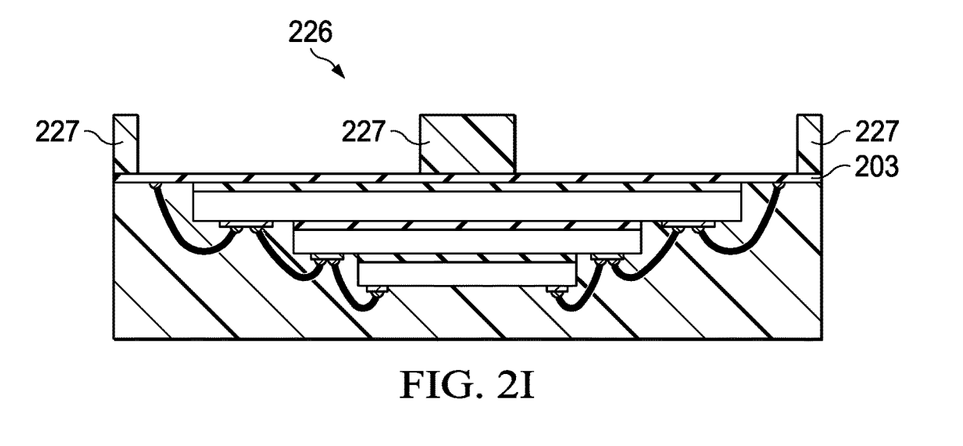

In FIG. 2H, carrier 201 and thermal release tape 202 of prepared temporary carrier 200 are debonded from encapsulated assembly 223 leaving only seed layer 203, thus producing debonded assembly 225. In FIG. 2I, PR layer 227 is patterned over seed layer 203 to produce patterned assembly 226.

Figure 2J:
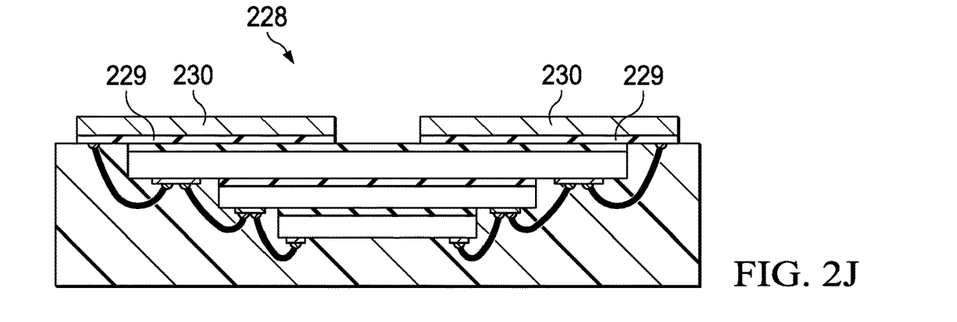

In FIG. 2J, RDL layer 230 is formed between elements of PR layer 227 over etched layer 229 using one or more etching, electroplating, deposition, and/or stripping operations, thus producing re-distribution assembly 228. In some cases, seed layer 203 may be patterned along with PR layer 227, for example, using a wet etch removal process, thus making seed layer 203 discontinuous.

Figure 2K:
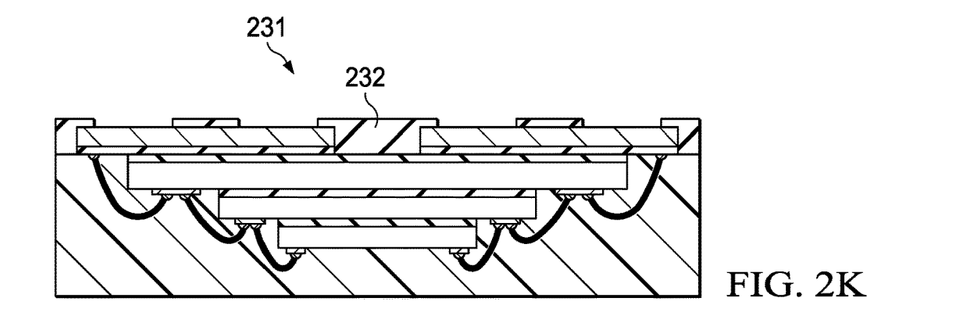

In FIG. 2K, re-passivation layer 232 is formed in selected openings between features of RDL layer 230, thus producing re-passivated assembly 213. Examples of materials used for re-passivation layer 232 include but are not limited to silicon nitride, silicon dioxide, silicon oxynitride, polyimide, and other suitable dielectric materials.

Figure 2L:
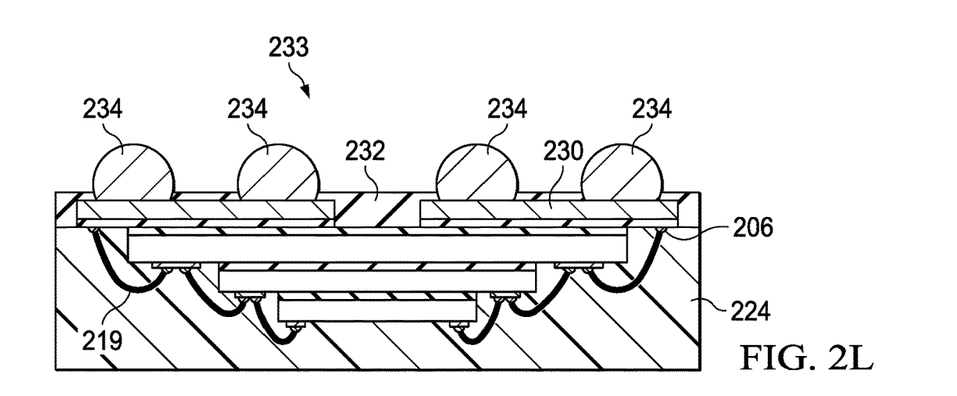

In FIG. 2L, solder bumps 234 are formed in openings of re-passivation layer 232 to create direct connections through traces in RDL layer 230 to wire bond locations 206, thus producing semiconductor package 233 with multiple stacked dies and embedded wiring on re-distributed bumps, without any substrate or lead frame. Here it should be noted that FIG. 2L is intended to illustrate that solder bumps 234 may be formed in any suitable location of semiconductor package 233. In an actual design layout, however, solder bumps 234 may be further isolated from each other—that is, gaps may be formed in RDL layer 230 between solder bumps 234.

In some cases, after carrier debonding (FIG. 2H), a second carrier may be considered as process option as warpage and die registration holder before continuing to the bumping process for re-distribution layers stacking. Single or multiple re-distributed routes may be provided with solder ball mounts, plating bumps, or pillar bumps as alternative structures for different signal output performance.

As such, the processes of FIGS. 2A-L begin with a temporary carrier (prepared with thermal release tape and sputtering seed layer) configured to receive one or more chip(s) and/or passive electrical components which are then attached, wire bonded, and protected inside a mold compound in the absence of any lead frame or substrate carrier, but with alternative RDLs designed to maintain a desired package thickness.

In some cases, the processes of FIGS. 2A-L may be altered by: (i) adding a second carrier as warpage holder to carry on whole RDL or Under Bump Metallization (UBM) formation, (ii) slit coating or laminating of dielectric polymer and PR for uniformity control, (iii) implementing compensation capabilities using exposure tools such as a Laser Direct Imaging (LDI) and stepper, (iv) only quartering to small panel size accommodated with solder ball mount equipment, and/or (v) electroplating bump, stud, or pillar bumps.

Figure 3:
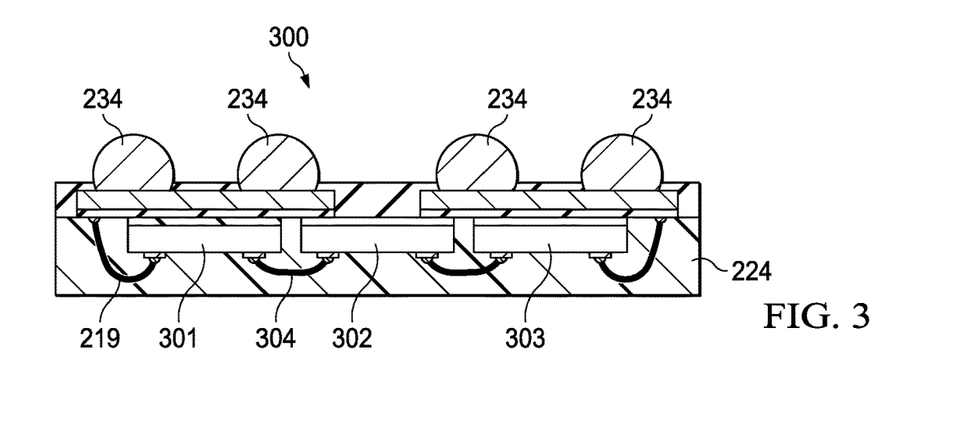
FIG. 3 is a cross-sectional view illustrating an example of a semiconductor package with multiple dies in a side-by-side configuration and embedded wiring on re-distributed bumps, according to some embodiments.

FIG. 3 is a diagram illustrating an example of semiconductor package 300 with multiple dies 301, 302, and 303 in a side-by-side configuration and embedded wiring on re-distributed bumps. To provide direct connections between dies 301 and 302, for example, wire bond 304 may be formed between pads on dies 301 and 302.

In various embodiments, semiconductor package 300 may be fabricated using the processes of FIGS. 2A-J. For instance, three die attached locations 205 may be marked next to each other in the same area 209 of prepared temporary carrier 200, and each die attached location may receive a corresponding one of dies 301, 302, and 303. In other cases, however, a different number of side-by-side dies may be used (e.g., two, four, etc.).

FIGS. 4A-H are diagrams illustrating an example of a process for fabricating a semiconductor package with embedded components and embedded wiring on re-distributed bumps. In this embodiment, the process may also with preparation of a temporary carrier with thermal release tape and seed layer sputtering to produce prepared temporary carrier 200.

Figure 4A:
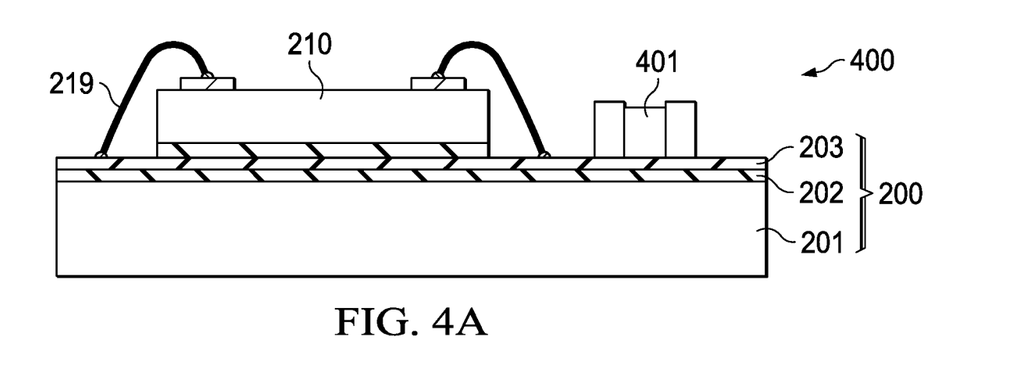
FIGS. 4A-H are diagrams illustrating an example of a process for fabricating a semiconductor package with embedded components and embedded wiring on re-distributed bumps, according to some embodiments.
Figure 4B:
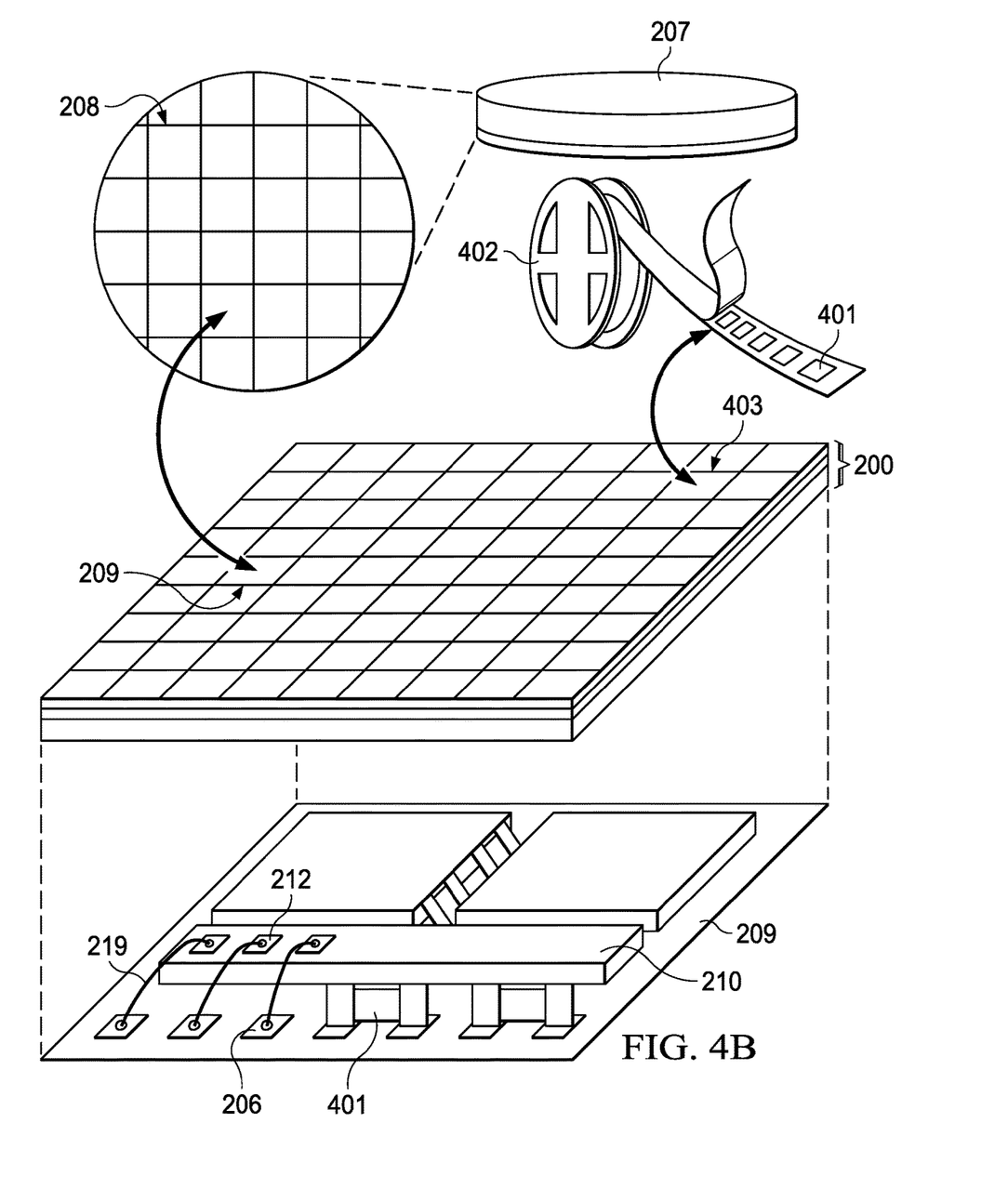

In FIGS. 4A and 4B, die 210 is singulated from wafer 207 and placed at location 209 of prepared temporary carrier 200. Moreover, passive electronic component 401 (e.g., a capacitor, resistor, inductor, etc.) may be removed from tape and reel 402 and placed at location 403 of prepared temporary carrier 200. Each terminal of passive electronic component 401 may also be coupled to respective wire bond locations 206 using any suitable surface-mount technology (SMT). Wire bond 219 may provide a connection between pad 212 of die 210 and wire bond location 206, thus producing wire bonded assembly 400.

Figure 4C:
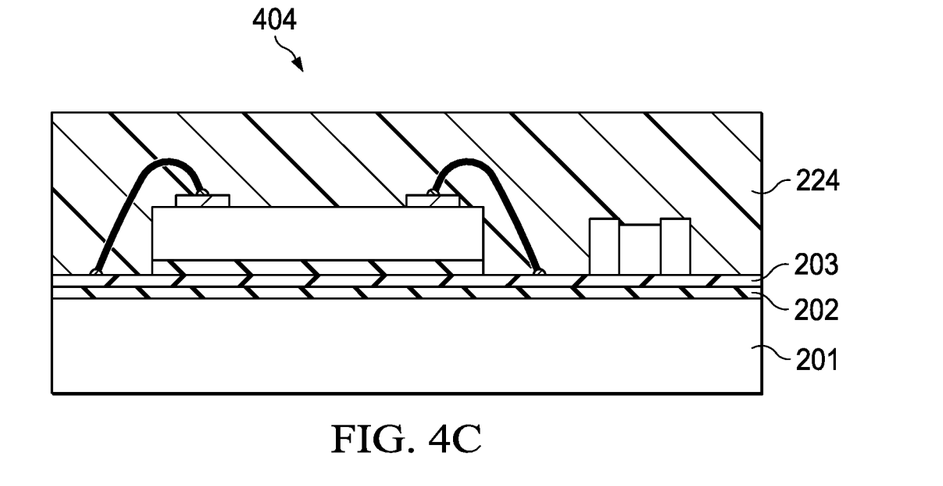
Figure 4D:
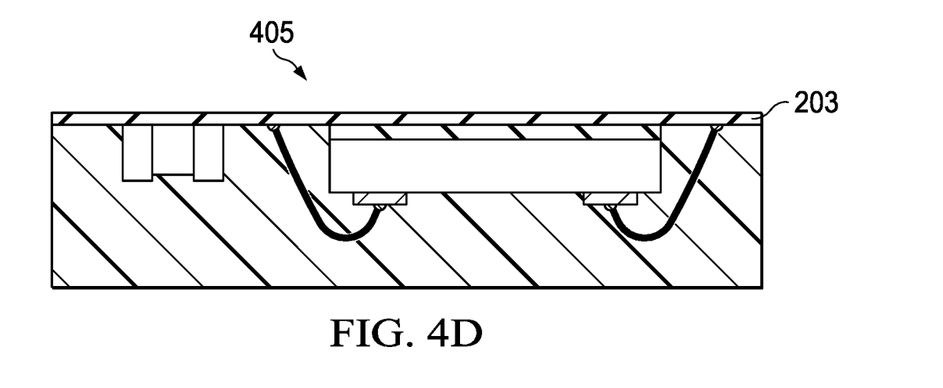
Figure 4E:
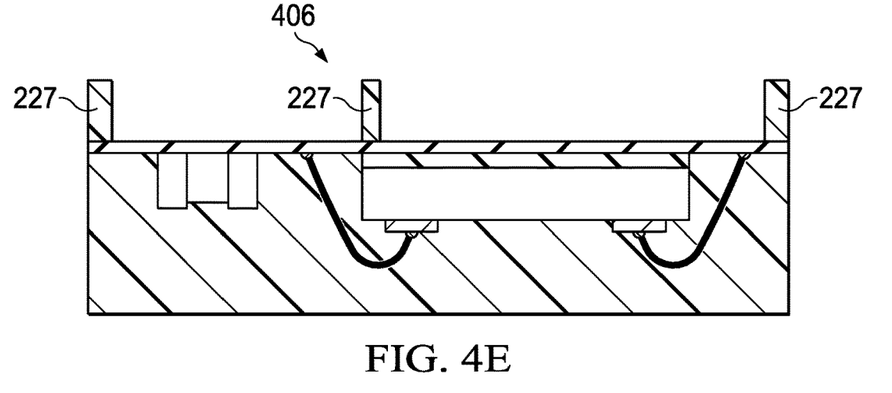

In FIG. 4C, wire bonded assembly 400 is encapsulated by mold compound 224, thus producing encapsulated assembly 404. In FIG. 4D, carrier 201 and thermal release tape 202 of prepared temporary carrier 200 are debonded from encapsulated assembly 404 leaving only seed layer 203, thus producing debonded assembly 405. In FIG. 4E, PR layer 227 is patterned over seed layer 203 to produce patterned assembly 406.

Figure 4F:
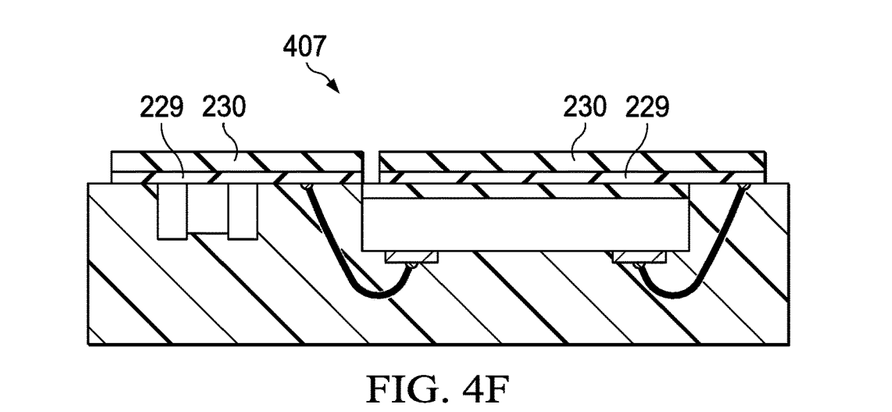
Figure 4G:
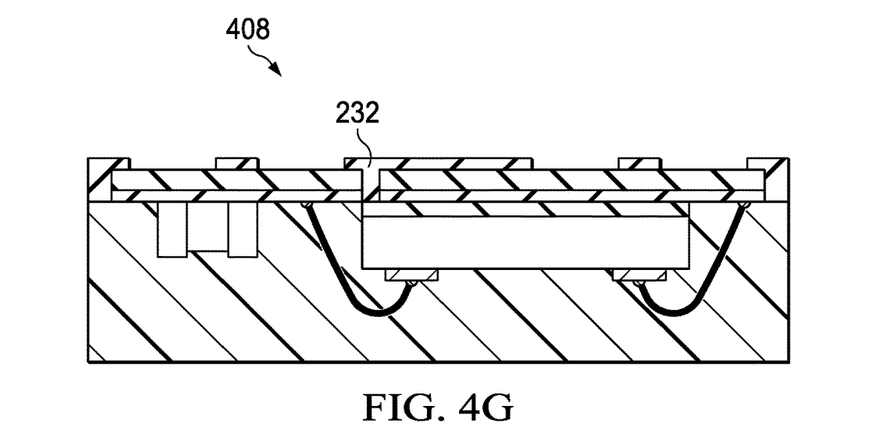
Figure 4H:
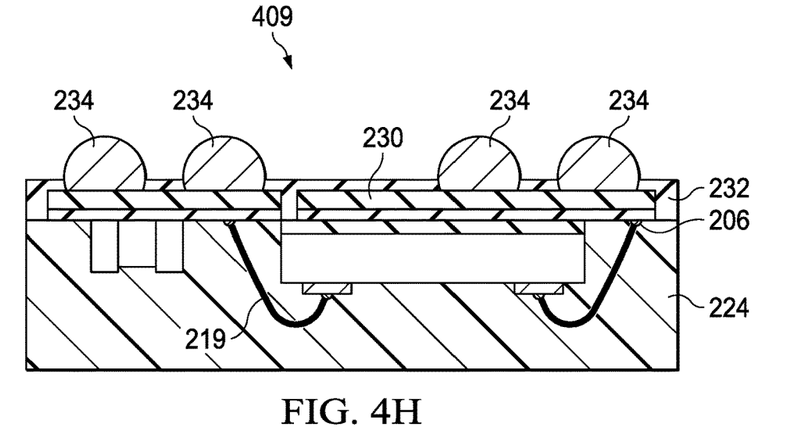

In FIG. 4F, RDL layer 230 is formed between elements of PR layer 227 over etched layer 229 using one or more etching, electroplating, deposition, and/or stripping operations, thus producing re-distribution assembly 407. In FIG. 4G, re-passivation layer 232 is formed in selected openings between features of RDL layer 230, thus producing re-passivated assembly 408. In FIG. 4H, solder bumps 234 are formed in openings of re-passivation layer 232 to create a direct connection, though traces in RDL layer 230, to wire bond locations 206, thus producing semiconductor package 409 with embedded components and embedded wiring on re-distributed bumps, without a substrate or lead frame.

Figure 5A:
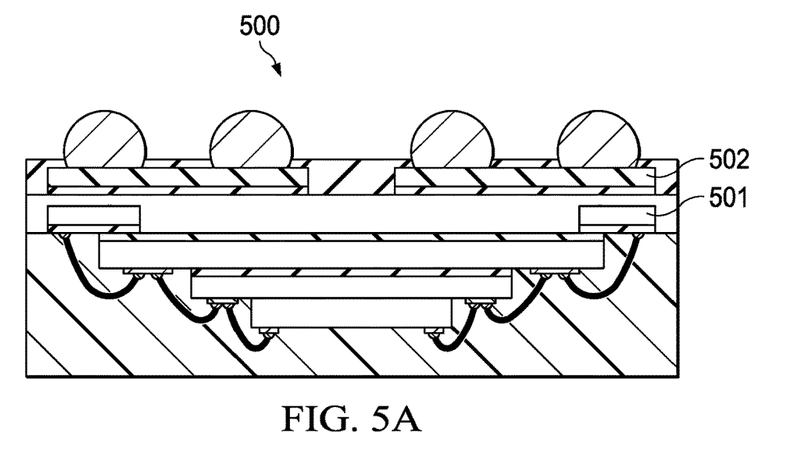
FIGS. 5A-D are cross-sectional views illustrating examples of different semiconductor package configurations, according to some embodiments.
Figure 5B:
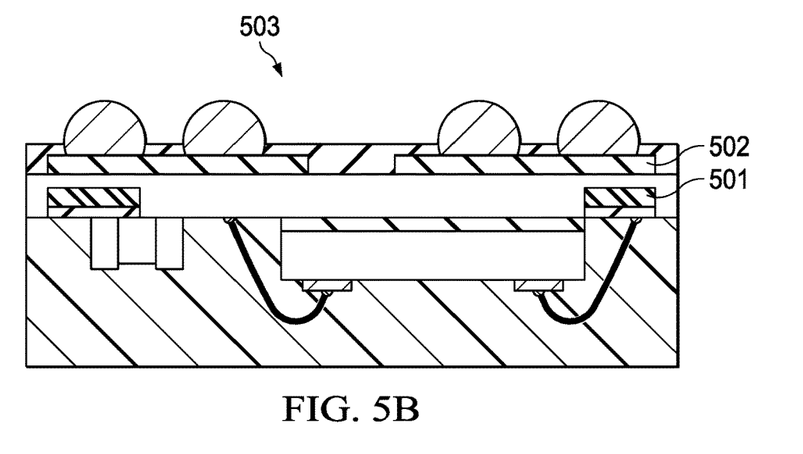

FIGS. 5A-D are diagrams illustrating examples of different semiconductor package configurations. Particularly, FIG. 5A shows semiconductor package 500 similar to package 233 of FIG. 2J, and FIG. 5B shows semiconductor package 503 similar to package 409 of FIG. 4G. In these examples, however, each of packages 500 and 503 has two RDL layers 501 and 502 directly coupled to each other; both packages fabricated in the absence of any substrate or lead frame. In other implementations, any suitable number of RDL layers may be used.

Figure 5C:
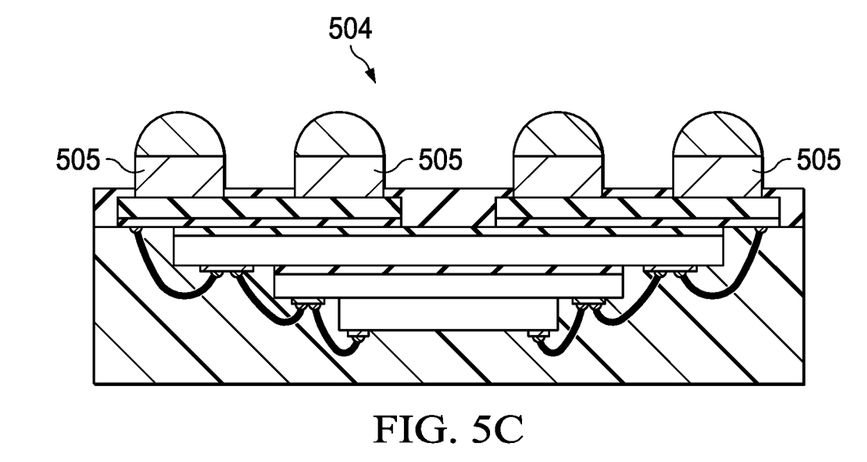
Figure 5D:
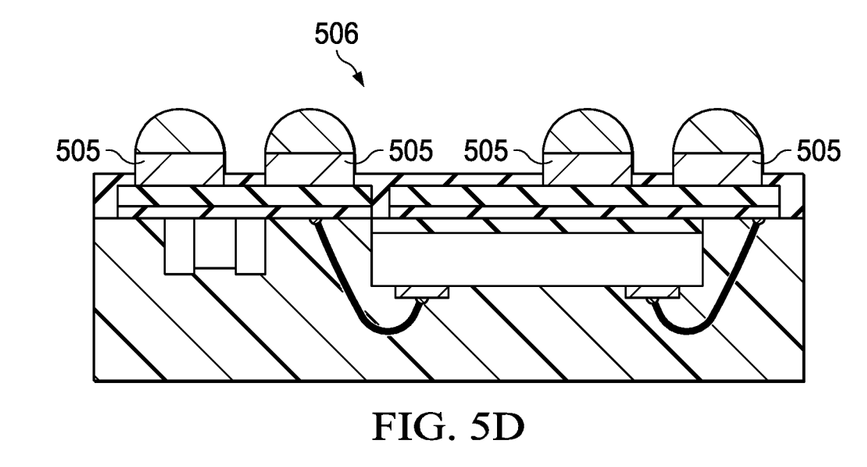

Meanwhile, FIG. 5C shows semiconductor package 504 similar to package 233 of FIG. 2J and FIG. 5D shows semiconductor package 506 similar to package 409 of FIG. 4G. These examples use pillar bumps 505 instead of solder bumps 234. In other implementations, any suitable type of bumping structure may be used (e.g., plating bumps, posts, etc.).

Figure 6:
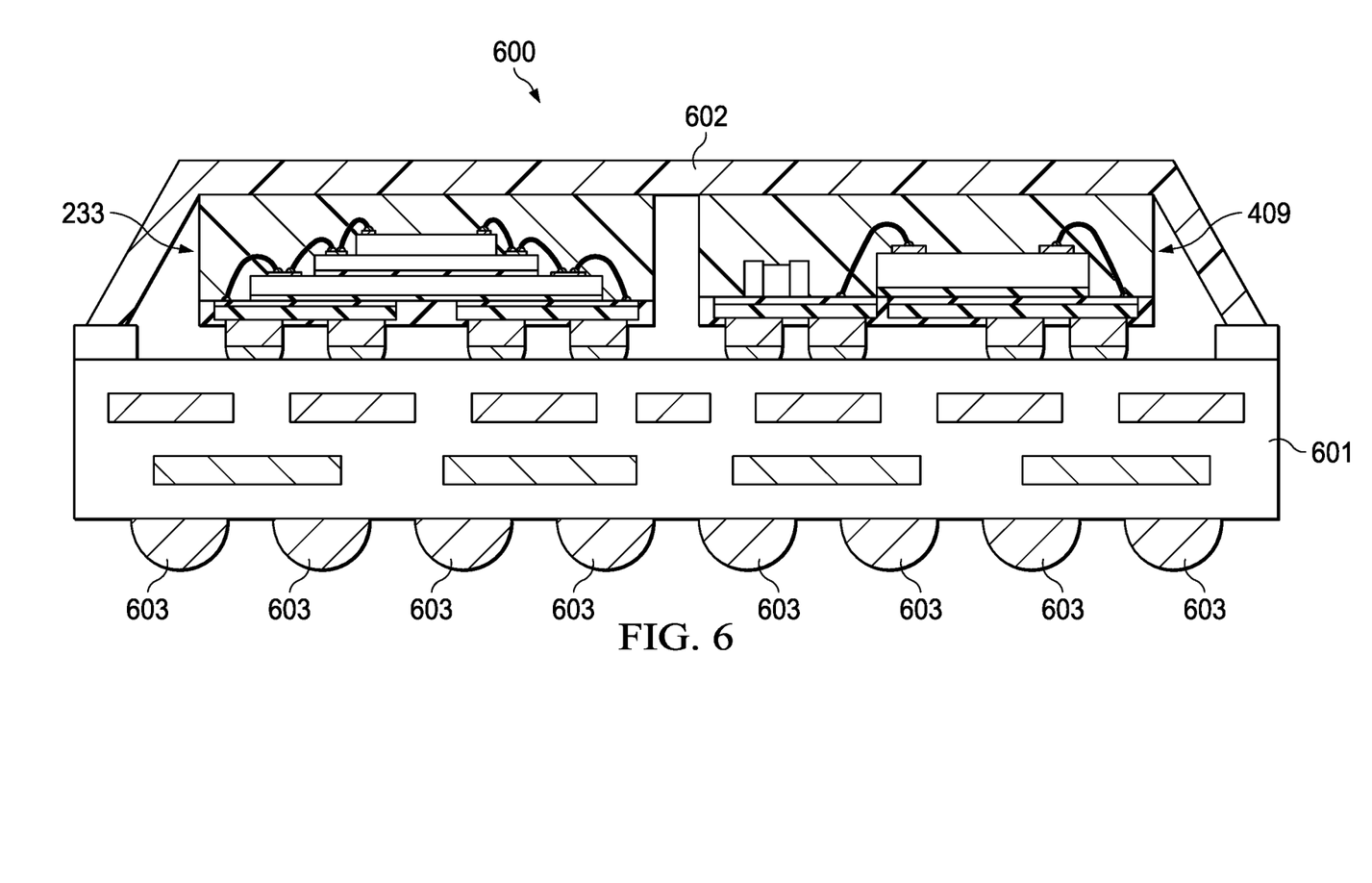
FIG. 6 is a cross-sectional view of different types of semiconductor packages with embedded wiring on re-distributed bumps encapsulated together and coupled to a substrate carrier, according to some embodiments.

FIG. 6 is a diagram of heterogeneous package 600 where mold compound 602 encapsulates multiple semiconductor packages 233 and 409 with embedded wiring on re-distributed bumps. Internal bumping structures couple semiconductor packages 233 and 409 to substrate 601 in the absence of substrates or lead frames internal to those individual packages. Moreover, bumping structures 603 may be used to couple heterogeneous package 600 to a PCB of an electronic device (e.g., a computer, etc.).

As such, systems and methods described herein may provide for wire-bond connecting chips and RDLs without a permanent lead frame or substrate. Wire-bond connecting enables high allowable input currents for high power chips and distributed RDL layouts. Wire-bond on finer RDL traces is also available with alternative bump structures. Both wiring and RDL may use a purely Cu composition for better conductivity. Moreover, mold compound encapsulation of embedded wiring, chips, and passives enable heterogeneous integration (HI) with finer pitch bumps and finer RDL traces for routing, which can be useful in certain 2.5D IC applications (e.g., 409). Large-size temporary carriers may be used for large panel processes.

In some cases, these systems and methods may produce semiconductor packages that are smaller than conventional packages because no lead frame or substrate carrier is used. These systems and methods may also reduce costs by enabling heterogeneous integration or embedded stack chips and/or chips-passives side-by-side. Furthermore, these systems and methods may result in improved performance because of all-Cu interconnects in wiring and RDLs.

In the embodiments shown, semiconductor packages 223, 300, 409, 500, 503, 504, 506, and 600, for example, are chip scale packaging (CSP) packages that can be attached to a carrier, such as a PCB or a substrate, such as a laminate substrate or ceramic substrate, or another package. CSP packages generally have a package footprint equal to or less than 1.2 times the die footprint, and may have a pitch equal or less than 0.8 mm.

While certain embodiments described herein may show a wafer level CSP package, systems and methods described herein may also be applicable to other package types, such as a fan out wafer level packaging (FOWLP) package, a ball grid array (BGA) package, or other package types that are otherwise configured to be attached by joints (e.g., solder balls, solder bumps such as C4 bumps, Cu pillars, Cu studs, or other conductive metal joints) to a suitable surface (e.g., a PCB, a substrate, a lead frame, an interposer, or another package). An example wafer level chip scale packaging (WLCSP) fabrication process for a package that includes formation of an underfill structure.

In an illustrative, non-limiting embodiment, a semiconductor package may include an integrated circuit (IC) having a plurality of pads, and an RDL layer coupled to the IC without any substrate or lead frame therebetween, where the RDL comprises a plurality of terminals, and wherein one or more of the plurality of pads are wire bonded to a corresponding one or more of the plurality of terminals. For example, the IC may include a chip. The IC may also include a passive electrical device coupled to the chip.

The semiconductor package may include a plurality of solder balls or pillar bumps coupled to a side of the RDL opposite the plurality of pads. The semiconductor package may also include a second IC stacked upon the IC, where the second IC comprises a second plurality of pads, and where at least one of the second plurality of pads is wire bonded to a corresponding one of the plurality of pads. The semiconductor package may further include a second IC coupled to the RDL and disposed side-by-side with respect to the IC, where the second IC comprises a second plurality of pads, and where at least one of the second plurality of pads is wire bonded to a corresponding one of the plurality of pads.

In another illustrative, non-limiting embodiment, a method may include: forming a seed layer on a temporary carrier, the seed layer comprising a plurality of die attach locations and a plurality of wire bond locations associated with each of the plurality of die attach locations; attaching, to one of the plurality of die attach locations, a die having a plurality of pads; and wire bonding at least one of the plurality of pads to at least one of the plurality of wire bond locations to produce a wire bonded die. In various implementations, the method may also include laser marking the plurality of die attach locations and the plurality of wire bond locations on the seed layer.

The method may include attaching a passive electrical component to one or more of the plurality of wire bond locations. The method may also include stacking a second die upon the die, where the second die comprises a second plurality of pads. The method may further include wire bonding at least one of the second plurality of pads to a corresponding one of the plurality of pads.

Additionally, or alternatively, the method may include: attaching, to another one of the plurality of die attach locations disposed side-by-side with respect to the one of the plurality of die attach locations, a second die having a second plurality of pads; and wire bonding at least one of the second plurality of pads to a corresponding one of the plurality of pads. The method may also include: encapsulating the wire bonded die to produce an encapsulated die; debonding the temporary carrier from the encapsulated die; and forming an RDL layer upon the encapsulated die. The RDL may be formed on the encapsulated die without any substrate or lead frame therebetween.

Particularly, forming the RDL may include, after debonding of the carrier, applying a PR pattern to the encapsulated die, etching selected areas of the seed layer to match at least a portion of the PR pattern, forming conductor traces on the encapsulated die using the PR pattern, and creating a passivation layer over the conductor traces that leaves one or more openings electrically coupled to one or more of the wire bond locations. Forming the conductor traces may include performing an etching operation and an electroplating operation. The method may further include forming one or more solder balls or pillar bumps at the one or more openings.

In yet another illustrative, non-limiting embodiment, an electronic device may include: a PCB and a semiconductor package coupled to the PCB, where the semiconductor package includes: a first die having a first plurality of pads, and an RDL layer coupled to the first die without any substrate or lead frame therebetween, where the RDL comprises a plurality of terminals, and where one or more of the first plurality of pads are wire bonded to a corresponding one or more of the plurality of terminals.

The semiconductor package may include a second die stacked upon the first die, where the second die comprises a second plurality of pads, and where at least one of the second plurality of pads is wire bonded to a corresponding one of the first plurality of pads. The semiconductor package may also include a second die coupled to the RDL and disposed side-by-side with respect to the first die, where the second die comprises a second plurality of pads, and where at least one of the second plurality of pads is wire bonded to a corresponding one of the first plurality of pads.

In many implementations, systems and methods described herein may be incorporated into a wide range of electronic devices including, for example, computer systems or Information Technology (IT) products such as servers, desktops, laptops, memories, switches, routers, etc.; telecommunications hardware; consumer devices or appliances such as mobile phones, tablets, wearable devices, IoT devices, television sets, cameras, sound systems, etc.; scientific instrumentation; industrial robotics; medical or laboratory electronics such as imaging, diagnostic, or therapeutic equipment, etc.; transportation vehicles such as automobiles, buses, trucks, trains, watercraft, aircraft, etc.; military equipment, etc. More generally, these systems and methods may be incorporated into any device or system having one or more electronic parts or components.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Reference is made herein to "configuring" a device or a device "configured to" perform some operation(s). It should be understood that this may include selecting predefined logic blocks and logically associating them. It may also include programming computer software-based logic of a retrofit control device, wiring discrete hardware components, or a combination of thereof. Such configured devices are physically designed to perform the specified operation(s).

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

What is claimed is:

1. A method, comprising:
    forming a seed layer on a temporary carrier, the seed layer comprising a plurality of die attach locations and a plurality of wire bond locations associated with each of the plurality of die attach locations;
    attaching, to one of the plurality of die attach locations, a die having a plurality of pads;
    wire bonding at least one of the plurality of pads to at least one of the plurality of wire bond locations to produce a wire bonded die;
    encapsulating the wire bonded die to produce an encapsulated die;
    debonding the temporary carrier from the encapsulated die;
    after debonding the temporary carrier, forming a redistribution layer (RDL) upon the encapsulated die; and
    forming a passivation layer over the RDL, the passivation layer including openings that extend through the passivation layer to the RDL.

2. The method of claim 1, further comprising laser marking the plurality of die attach locations and the plurality of wire bond locations on the seed layer.

3. The method of claim 1, further comprising attaching a passive electrical component to one or more of the plurality of wire bond locations.

4. The method of claim 1, further comprising:
    stacking a second die upon the die, wherein the second die comprises a second plurality of pads.

5. The method of claim 4, further comprising:
    wire bonding at least one of the second plurality of pads to a corresponding one of the plurality of pads.

6. The method of claim 1, further comprising:
    attaching, to another one of the plurality of die attach locations disposed side-by-side with respect to the one of the plurality of die attach locations, a second die having a second plurality of pads; and
    wire bonding at least one of the second plurality of pads to a corresponding one of the plurality of pads.

7. The method of claim 1, wherein the RDL is formed on the encapsulated die without any substrate or lead frame therebetween.

8. The method of claim 1, wherein forming the RDL further comprises:
   after debonding of the temporary carrier, applying a photoresist (PR) pattern to the encapsulated die;
   etching selected areas of the seed layer to match at least a portion of the PR pattern; and
   forming conductor traces on the encapsulated die using the PR pattern.

9. The method of claim 8, wherein forming the conductor traces further comprises performing an etching operation and an electroplating operation.

10. The method of claim 8, further comprising forming one or more solder balls or pillar bumps at the one or more openings in the passivation layer.

\* \* \* \* \*